(12) United States Patent
Chaki

(10) Patent No.: US 6,922,115 B2
(45) Date of Patent: Jul. 26, 2005

(54) ATTENUATOR WITH SWITCHABLE TRANSISTORS FOR CONTROLLING ATTENUATION

(75) Inventor: Shin Chaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 99 days.

(21) Appl. No.: 10/445,041

(22) Filed: May 27, 2003

(65) Prior Publication Data

US 2004/0119558 A1 Jun. 24, 2004

(30) Foreign Application Priority Data

Dec. 19, 2002 (JP) .................................... 2002-367691

(51) Int. Cl.[7] .............................................. H01P 1/22
(52) U.S. Cl. ...................... 333/81 A; 333/161; 333/116
(58) Field of Search ............................. 333/81 A, 161, 333/104, 116

(56) References Cited

U.S. PATENT DOCUMENTS

| | | | |
|---|---|---|---|
| 4,837,530 A | * | 6/1989 | Kondoh ................... 333/81 A |
| 5,157,323 A | | 10/1992 | Ali et al. |
| 5,309,048 A | * | 5/1994 | Khabbaz ................... 333/81 A |
| 5,349,312 A | | 9/1994 | Huettner et al. |
| 5,382,847 A | * | 1/1995 | Yasuda ........................ 326/68 |
| 5,436,578 A | * | 7/1995 | Brown et al. ................. 326/87 |
| 5,457,407 A | * | 10/1995 | Shu et al. ..................... 326/30 |
| 5,638,007 A | * | 6/1997 | Sabin ........................ 326/27 |
| 5,654,652 A | * | 8/1997 | Raza et al. ................... 327/17 |
| 6,545,563 B1 | * | 4/2003 | Smith ........................ 333/103 |
| 6,759,874 B2 | * | 7/2004 | Braun et al. .................. 326/87 |
| 6,794,909 B1 | * | 9/2004 | Urakami et al. ............. 327/112 |

FOREIGN PATENT DOCUMENTS

| | | |
|---|---|---|
| JP | 6-77762 | 3/1994 |
| JP | 6-232607 | 8/1994 |
| JP | 7-312508 | 11/1995 |
| JP | 10-261925 | 9/1998 |
| JP | 2001-102882 | 4/2001 |
| JP | 2001-244706 | 9/2001 |

* cited by examiner

*Primary Examiner*—Michael Toker
*Assistant Examiner*—Lam T. Mai
(74) *Attorney, Agent, or Firm*—Leydig, Voit & Mayer, Ltd.

(57) ABSTRACT

An attenuator with a simple circuit configuration is and accurate attenuation includes four transistors connected in parallel between a connecting point on a main line and a ground. Since the transistors are individually brought into an "ON" state and an "OFF" state to function as "resistors" or "capacitors", a desired attenuation be obtained by combinations of the ON and OFF states of the respective transistors.

7 Claims, 4 Drawing Sheets

Fig. 1
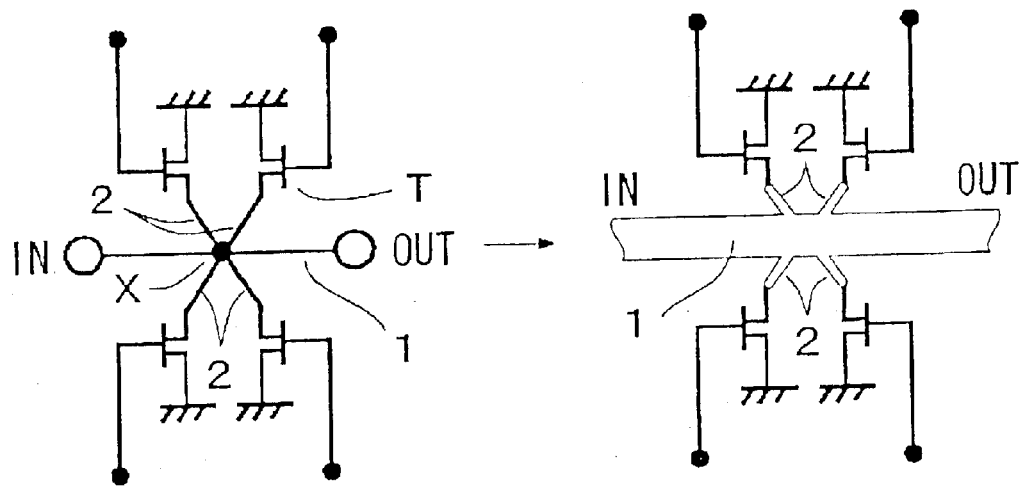
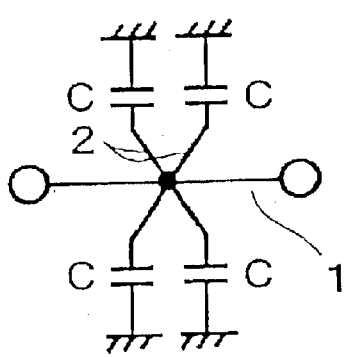
Fig. 2A
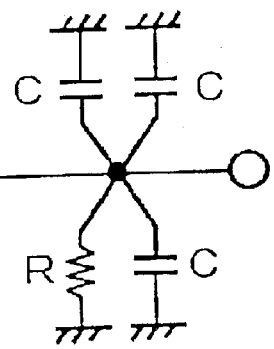
Fig. 2B
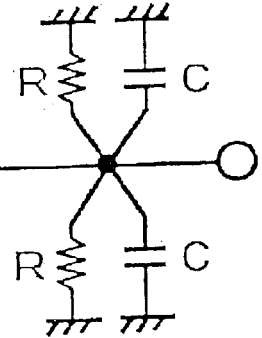
Fig. 2C
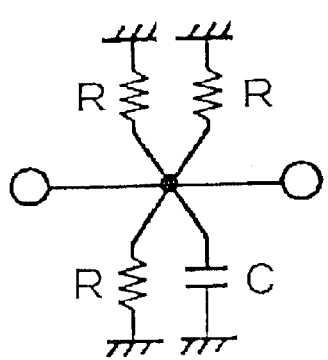
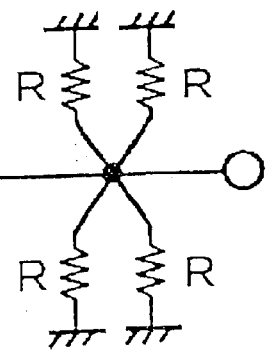
Fig. 2D     Fig. 2E

ATTENUATOR WITH SWITCHABLE TRANSISTORS FOR CONTROLLING ATTENUATION

BACKGROUND OF THE INVENTION

1. Field of the Invention

The present invention relates to a high frequency signal attenuator, and more specifically relates to a miniaturized attenuator in which an attenuation of a passing signal is limited to 4 to 5 dB in order to enable use in combination with an amplifier having gain dispersion and gain temperature characteristics.

2. Description of the Related Art

When incorporating an amplifier into a system, it is desirable that particularly gain has uniform characteristics in a specified temperature range or between chips. This is because a level diagram in the entire system can be maintained constant. When the gain of the amplifier is reduced, an output of the amplifier reduces and a following circuit cannot be driven. Moreover, when the gain of the amplifier is increased, a final-stage transistor in the amplifier is brought into an over input state, and thus there is a possibility that a problem of reliability arises.

In order to make the gain uniform between the chips, there is a method of adjusting a bias to be applied to a transistor so as to maintain the gain constant. For example, in the case of a two-stage amplifier, a gate voltage and a drain voltage at a first stage or a gate voltage and a drain voltage at a second stage are adjusted so that the entire gain is adjusted.

However, this method causes (1) a problem that a power consumption changes and (2) a problem that in the case where the amplifier is configured at more stages, an adjustable range is limited because an output level and input levels of the transistors at respective stages as well as the gain should be considered. In the case where there is a plurality of amplifiers, the adjusting methods become fairly complicated so that a throughput of manufacturing is lowered.

Another method is a method of combining an attenuator with an amplifier so as to form a system. Typical one of such a method is a method of connecting resistors corresponding to gain dispersion of an amplifier in series. This method can reduce the gain dispersion of the amplifier, but it is difficult to compensate temperature characteristics of the gain.

Publicly known examples of the attenuator will be cited below.

There is an example including a lange coupler having four ports and a plurality of series circuits configured by FET and resistor which are connected in parallel to two ports of the coupler (for example, see Patent Document 1).

There is an example which π type and T type resistor attenuating circuits are combined complicatedly in order to obtain an attenuating ability with high accuracy (for example, see Patent Document 2.

There is an example which two series circuits, each configured by FET and resistor, are connected in parallel at an inlet side and an outlet side of a line having λ/4 wavelength (for example, see Patent Document 3).

There is an example which a second gate terminal is connected to a drain in a dual gate transistor in order to improve nonlinearity generated by inserting an attenuator (for example, see Patent Document 4).

There is an example which a bias voltage is applied to a drain of a transistor via a choke coil in order to improve nonlinearity generated by inserting an attenuator (for example, see Patent Document 5).

There is an example which a transistor for bias is connected to a gate of a transistor for amplification and a gain control voltage is supplied to a gate of the transistor for bias so that linearity is not deteriorated even if the gain is varied by a high frequency amplifying circuit (for example, see Patent Document 6).

There is an example which has a complicated circuit configured by plural-stage transistors and plural-stage attenuators in order not to damage linearity and in order to obtain a large gain variable width even if the gain is varied by a high frequency amplifying circuit (for example, see Patent Document 7).

There is an example which one end of a high impedance line is connected with a microwave line and a PIN diode as a variable impedance element is connected with the other end in order to attenuate an over input (for example, see Patent Document 8).

Patent Document 1

Japanese Patent Application Laid-Open No. 06-232607 (1994) "ATTENUATOR" (Paragraph No. [0008], FIG. 1).

Patent Document 2

Japanese Patent Application Laid-Open No. 06-112767 (1994) "LOW-LOSS ATTENUATOR TO BE SWITCHED" (claim 1, FIG. 2).

Patent Document 3

Japanese Patent Application Laid-Open No. 07-312508 (1995) "VARIABLE ATTENUATOR" (paragraph No. [0019], FIG. 1).

Patent Document 4

Japanese Patent Application Laid-Open No. 50-97252 (1975) "VARIABLE RESISTANCE DEVICE" (claims, FIG. 4).

Patent Document 5

Japanese Patent Application Laid-Open No. 06-77762 (1994) "VARIABLE ATTENUATOR" (paragraph No. [0005], FIG. 1).

Patent Document 6

Japanese Patent Application Laid-Open No. 10-261925 (1998) "HIGH FREQUENCY AMPLIFIER" (paragraph No. [0020], FIG. 1).

Patent Document 7

Japanese Patent Application Laid-Open No. 2001-102882 "HIGH FREQUENCY AMPLIFIER" (paragraph Nos. [0024] through [0031], FIG. 1).

Patent Document 8

Japanese Patent Application Laid-Open No. 2001-244706 "VARIABLE ATTENUATOR" (paragraph Nos. [0009] through [0031]FIG. 1).

In the patent documents 1 and 2, although an accurate attenuation value can be obtained, the circuit configuration is complicated and miniaturization is difficult. Also in the patent document 3, since the example requires a line with specified wavelength and a four-system attenuation circuit, miniaturization is difficult, and since the attenuation circuits are provided separately, an L component is included and thus it is difficult to obtain a constant attenuation value with wide band. In the patent documents 4 through 7, since the examples require a bias power source, a choke coil and a complicated attenuator, miniaturization is difficult. The example in the patent document 8 is a limitter circuit, and it cannot obtain a constant attenuation value regardless of an input level.

SUMMARY OF THE INVENTION

The present invention provides a small attenuator which a passing loss is constant in wide bandwidth and an amplifier to be combined can be integral with the attenuator.

A plurality of, for example, four transistors are connected in parallel between one node on a main line and a ground. Since an "ON" or "OFF" state of the transistors function as "resistor" or "capacitor", an attenuator having a desirable passing loss can be obtained by combinations of "ON" and "OFF" of the respective transistors.

BRIEF DESCRIPTION OF THE DRAWINGS

FIG. 1 is a circuit diagram and a layout pattern diagram of an attenuator according to a first embodiment of the present invention;

FIGS. 2A through 2E are diagrams showing operating examples of the attenuator in FIG. 1;

DETAILED DESCRIPTION OF THE PREFFERED EMBODIMENTS

First Embodiment

FIG. 1 shows a circuit diagram (left) and a layout pattern diagram (right) of an attenuator according to a first embodiment of the present invention. One node on a main line 1 is a connecting point X from which four branch lines 2 radially extend, and source and drain electrodes of transistors T (FET or HEMT) are connected as an input and an output between ends of the lines 2 and a ground respectively. These four transistors T are arranged so as to be horizontally and vertically symmetrical with respect to the connecting point X.

The four branch lines 2 have the same width and same length, but they are not limited to this. Moreover, the transistors are arranged to be symmetrically with respect to the connecting point X on the main line 1, but the arrangement is not limited to this. A number of the transistors is not limited to four. The diagram shows an input side (IN) and an output side (OUT) at both ends of the main line 1, but their positions may be reversed. This configuration is applied also to the following embodiments.

If the transistor is brought to "ON" or "OFF" state by controlling the voltage to be applied to the gate of the transistor, the transistor will act as "resistor" or "capacitor". In the case where the transistors T are resistor, an RF signal leaks so that a passing loss in the main line 1 increases. When the transistor T are capacitor, they are insulated not more than cutoff frequency corresponding to a capacitance value, and the RF signal does not leak so that the passing loss does not change.

Operating patterns in FIG. 1 where the four transistors are connected in parallel are shown in FIGS. 2A through 2E. In FIG. 2A, all the transistors are capacities C, thus the passing loss is not influenced. In FIG. 2E, all the transistors are resistors R, thus the passing loss becomes maximum. In FIG. 2B, one of the four transistors is a resistor; in FIG. 2C, two of the four transistors are resistors; in FIG. 2D, three of the four transistors are resistors. The passing loss of the main line 1 increases gradually in proportion to the number of resistor R, in the order of FIG. 2A, FIG. 2B, FIG. 2C, FIG. 2D and FIG. 2E.

Figure 3:
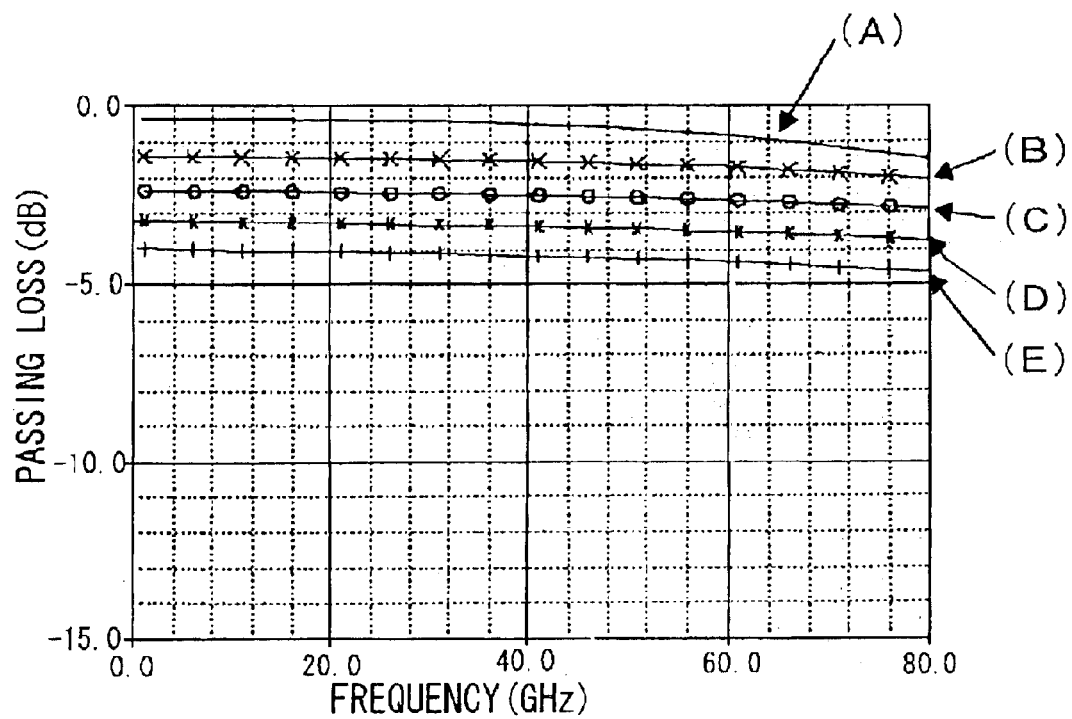
FIG. 3 is a graph showing a result of calculating frequency characteristics of a passing loss in the respective operating examples in FIGS. 2A–2F.

FIG. 3 shows a result of calculating frequency characteristics of the passing loss of the main line. It is found that the passing loss changes gradually according to the respective states shown in FIG. 2. Moreover, since a plurality of transistors are branched from one node on the main line and there is no redundant series line (L component), wide bandwidth characteristics can be obtained in all the operating states. Further, in an application where an attenuation value of a passing signal is comparatively small (about 4 to 5 dB), since a series line other than signal input and output lines is not necessary and a size of the transistors T is only about dozens $\mu$m, the small attenuator can be realized. Therefore, even in the case where the attenuator is combined with an amplifier, a packaging area does not become extremely large, so that the attenuator can be integral with the amplifier (forming one chip).

Second Embodiment

Figure 4:
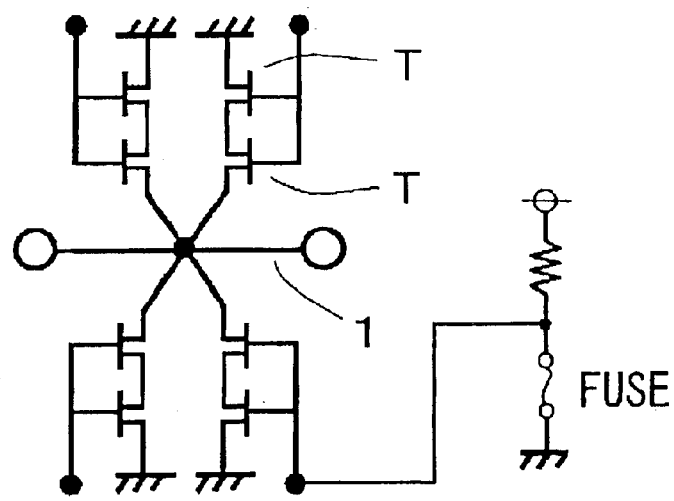
FIG. 4 is a circuit diagram of an attenuator according to a second embodiment of the present invention.

FIG. 4 shows a circuit of an attenuator according to a second embodiment of the present invention, and in this circuit, the four parallel transistors T in FIG. 1 and another transistors are connected in series. In the case where a size of the producible transistors is limited (in the case where "Wg" cannot be reduced to not less than a certain size), the transistors are connected in series so that desired high resistance can be realized. Moreover, a change width of the loss can be set small by the series connection.

In order to selectively turn on or off the transistors, a control signal is externally supplied to the gates, or a fuse circuit shown in FIG. 4 is used, so that the transistors may be turned on or off by fusing or nonfusing of the fuse.

Third Embodiment

Figure 5:
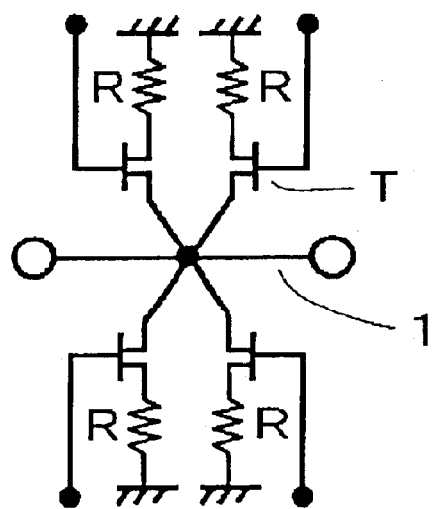
FIG. 5 is a circuit diagram of an attenuator according to a third embodiment of the present invention.

FIG. 5 shows a circuit of an attenuator according to a third embodiment of the present invention, and in this circuit, resistors R are inserted in the ground side of Transistors T in FIG. 1, respectively. The resistor R are used for finely adjusting an entire resistance value.

In the case where two-stage amplifier to be combined is changed for four-stage amplifier, for example, an adjusting range of the gain also changes. If this change can be made only by changing resistor R between a transistor and a ground at this time, it is seldom necessary to change a layout of the attenuator. Moreover, when the resistor R between the transistor and the ground is provided to an outside of an attenuator chip, a response to the change with the above specification becomes easy.

Fourth Embodiment

Figure 6:
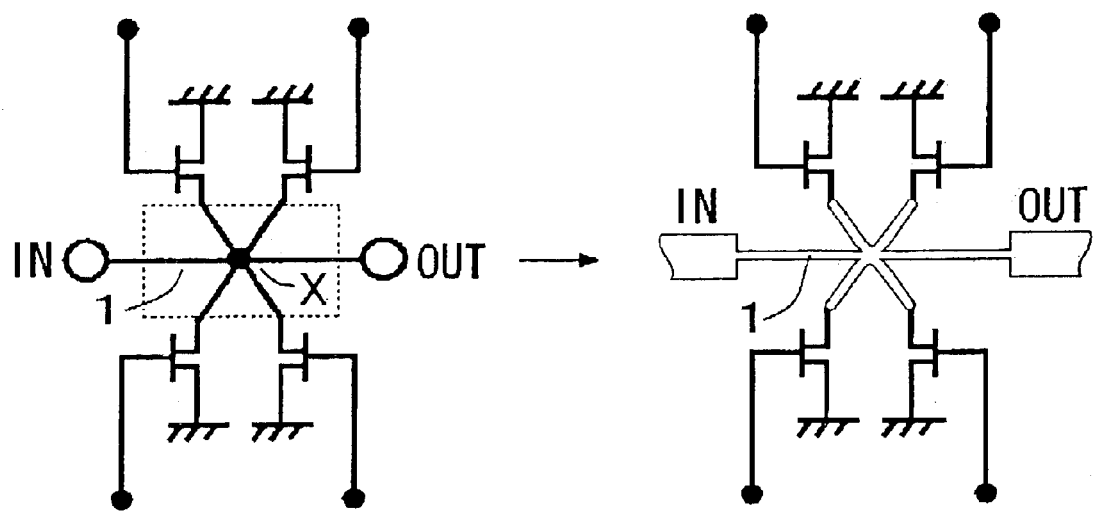
FIG. 6 is a circuit diagram and a layout pattern diagram of an attenuator according to a fourth embodiment of the present invention.

FIG. 6 shows a circuit diagram (left) and a layout pattern diagram (right) of an attenuator according to a fourth embodiment of the present invention, and in the attenuator shown in FIG. 1, a line width of the main line 1 is narrowed so that its characteristic impedance is higher than that (for example, 50 $\Omega$) of a transmission line in the main line 1 (portion surrounded by a broken line) before and after the connecting point X.

When the transmission line before and after the connecting point X has high impedance in such a manner, an effect for canceling an added portion of the capacity value in the case where the passing loss of FIG. 2A becomes minimum can be obtained, so that deterioration of reflection characteristics due to discontinuity of the characteristic impedance can be prevented.

Fifth Embodiment

Figure 7:
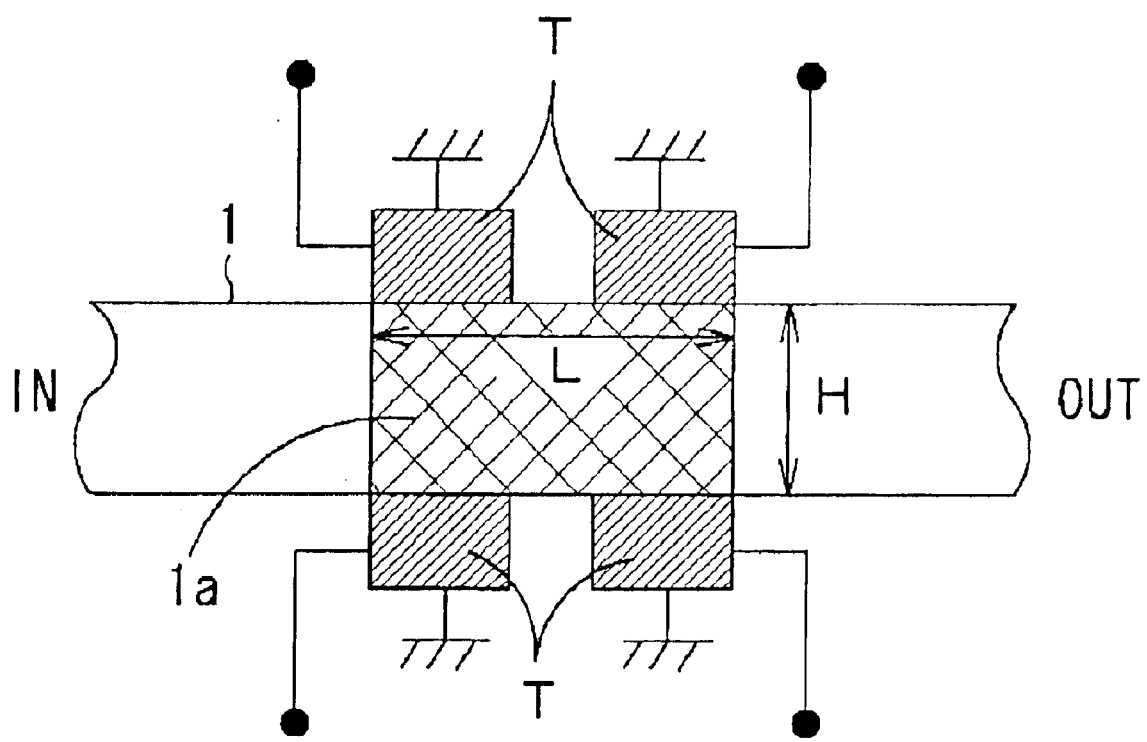
FIG. 7 is a layout pattern diagram of an attenuator according to a fifth embodiment of the present invention.

FIG. 7 shows a layout pattern diagram of an attenuator according to a fifth embodiment of the present invention. In the aforementioned embodiments, the predetermined portion on the main line 1 is the connecting point X. However, in the fifth embodiment, the predetermined portion is set on the main line 1 as a branch area 1a having the same width as the main line 1. And each of two transistors T which source and drain are connected between the branch area 1a and a ground with being in directly contact to the branch area 1a, are arranged at the upper and lower side as shown in the figure.

It is desirable that the branch area 1a is sufficiently small for a desired frequency wavelength, and for example, a dimension L of the main line 1 in its longitudinal direction is preferably not more than ¼ wavelength of a high frequency signal propagating through the main line 1. More preferably, in the longitudinal direction of the main line, the dimension L is not more than 10% of ¼ wavelength of the high frequency signal propagating through the main line 1.

In addition, a width W of the main line 1 is determined by a permittivity and a thickness of a substrate material. In a GaAs substrate with thickness of 100 $\mu$m, for example, the width W of the main line becomes 70 $\mu$m when the characteristic impedance is 50 Ω. Meanwhile, the dimension L is determined by a wavelength of the high frequency signal propagating through the main line 1 as mentioned above. In the case where, for example, a high frequency signal of 30 GHz propagates through the main line on the GaAs substrate with a thickness of 100 $\mu$m, since ¼ wavelength of 30 GHz is about 860 $\mu$m, about 80 $\mu$m which is not more than 10% of 860 $\mu$m is the dimension L in the longitudinal direction of the branch area 1a.

According to the fifth embodiment, the branch line 2 in FIG. 1 is omitted so that the L component can be reduced, and a constant attenuation value can be obtained with wider bandwidth.

The attenuator of the present invention is constituted so that a plurality of transistors are arranged in parallel between the predetermined portion on the main line and the ground and the transistors can be controlled so as to be turned on or off individually, and a redundant series line is not included. For this reason, the wide bandwidth frequency characteristics can be obtained. Although a fluctuation width of the passing loss is comparatively narrow in this attenuator, the size of the transistors is only about dozens $\mu$m. As a result, the circuit can be miniaturized, and even in the case where the attenuator is combined with the amplifier, the packaging area does not become extremely large, and thus it can be integral with the amplifier.

What is claimed is:

1. An attenuator comprising:
   a plurality of transistors connected in parallel via respective branch transmission lines to a node of a main transmission line and ground; and
   means for selectively placing the transistors, individually, in an ON state and an OFF state.

2. The attenuator according to claim 1, wherein the node of the main transmission line extends along a length in a main transmission line direction not longer than ¼ wavelength of a signal propagating through the main transmission line.

3. The attenuator according to claim 2, wherein the length of the node extending along the main transmission line direction is not longer than one-tenth of ¼ wavelength of a signal propagating through the main transmission line.

4. The attenuator according to claim 1, wherein the node is a point on the main transmission line to which all of the branch transmission lines are directly connected.

5. The attenuator according to claim 1, including 2 N transistors, wherein N is a positive integer and the transistors are symmetrically arranged on opposite sides of the main transmission line relative the node.

6. The attenuator according to claim 1, wherein the branch transmission lines have identical widths and lengths.

7. An attenuator comprising:
   a plurality of transistors connected in parallel via a plurality of branch lines extending between a location on a main transmission line and ground, wherein the main transmission line has a line width including a narrower portion with relatively higher characteristic impedance than wider portions of the main transmission line, the branch transmission lines being connecting to the narrower portion of the main transmission line; and
   means for individually placing the transistors in an ON state and an OFF state.

* * * * *